United States Patent [19]

Sawada et al.

[11] Patent Number: 6,001,676
[45] Date of Patent: Dec. 14, 1999

[54] SEMICONDUCTOR INTEGRATED CIRCUIT APPARATUS AND ASSOCIATED FABRICATION

[75] Inventors: Shigeki Sawada, Kyoto; Takashi Furuta, Shiga, both of Japan

[73] Assignee: Matsushita Electronics Corporation, Osaka, Japan

[21] Appl. No.: 09/009,273

[22] Filed: Jan. 20, 1998

Related U.S. Application Data

[62] Division of application No. 08/908,718, Aug. 8, 1997, abandoned, which is a continuation of application No. 08/570,964, Dec. 12, 1995, abandoned.

[30] Foreign Application Priority Data

May 29, 1995 [JP] Japan ................................ 7-130472

[51] Int. Cl.⁶ .............................................. H01L 21/8238
[52] U.S. Cl. ..................... 438/202; 438/234; 148/DIG. 9
[58] Field of Search ................................ 757/368, 369, 757/370, 378; 438/202, 234, FOR 219, FOR165, FOR 346; 148/DIG. 9

[56] References Cited

U.S. PATENT DOCUMENTS 5,098,638 3/1992 Sawada .................................... 437/31

FOREIGN PATENT DOCUMENTS 0 435 257 7/1991 European Pat. Off. .
63-281456 11/1988 Japan .
402284459 11/1990 Japan ............................ 438/FOR 219

OTHER PUBLICATIONS

Shigeki Sawada et al., "Base–Emitter Voltage Mismatch in a pair of Self–Aligned Bipolar Transistors", Proc. of IEEE 1990 Bipolar Circuits and Technology Meeting 8.3, Sep. 17–18, 1990, pp. 184–187.

Primary Examiner—Peter Toby Brown
Assistant Examiner—Long Pham
Attorney, Agent, or Firm—McDermott, Will & Emery

[57] ABSTRACT

Formed on a p-type semiconductor substrate are bipolar transistors and CMOS transistors. A bipolar transistor has a base extraction electrode a side-surface of which is covered with an oxide layer, a silicon nitride layer, and a polysilicon layer. A CMOS transistor has a gate electrode a side-surface of which is covered with an oxide layer, a silicon nitride layer, and a side-wall layer. The silicon nitride layer on the side-surface of the base extraction electrode is formed by the same fabrication step that the silicon nitride layer on the side-surface of the gate electrode is formed.

2 Claims, 8 Drawing Sheets

6,001,676

1

SEMICONDUCTOR INTEGRATED CIRCUIT APPARATUS AND ASSOCIATED FABRICATION

This is a divisional application of Ser. No. 08/908,718, filed Aug. 8, 1997, now abandoned, which is a file wrapper continuation of Ser. No. 08/570,964, filed Dec. 12, 1995, now abandoned.

BACKGROUND OF THE INVENTION

This invention relates to a semiconductor integrated circuit (SIC) apparatus formed of self-aligned, high-speed bipolar transistors, and CMOS transistors inseparably associated on a single body of semiconductor material, and to an associated fabrication method.

In recent years, mobile communication tools such as mobile telephones have made remarkable advances, and techniques capable of integration of high-frequency circuits and high-integration logic circuits in a single SIC are required. In other words, a technique is required which is capable of inextricably binding self-aligned, high-speed bipolar transistors suitable for, for example, high-speed ECL (emitter-coupled logic) circuits, and high-integration, low-power CMOS logic circuits, on a single semiconductor substrate.

There are various self-alignment techniques. For example, Japanese Patent Application, published under Pub. No. 63-281456, shows a self-alignment technique. In accordance with this technique, a transistor with a self-aligned base extraction electrode and a self-aligned emitter extraction portion and a CMOS transistor are placed on a single semiconductor substrate.

FIG. 8 is a cross section of an SIC apparatus made in accordance in a conventional self-alignment technique. 54 is a p-type semiconductor substrate of silicon. Formed on the silicon substrate 54 are three transistors of different types, i.e., an npn bipolar transistor 51, a p-channel MOS (PMOS) transistor 52, and an n-channel MOS (NMOS) transistor 53. 57 is a first well region of p-type which is formed as follows. An epitaxial layer of an n-type semiconductor material is deposited all over the substrate 54. Subsequently, a region for isolation between devices of the epitaxial layer is subjected to an ion implant step and to a thermal annealing step, whereupon the p-well region 57 is formed such that it extends down to the silicon substrate 54. 59 is a LOCOS (local oxidation of silicon) layer for isolation between devices. The npn bipolar transistor 51, the PMOS transistor 52, and the NMOS transistor 53 are described in detail by making reference to FIG. 8.

The structure of the bipolar transistor 51 is now explained. 55A is an n-type buried collector region that is formed in the substrate 54 by means of ion implant and thermal annealing. 56A is an n-type collector region formed by subjecting the n-type epitaxial layer deposited over the entirety of the substrate 54, to an ion implant step and to a thermal annealing step. 61 is an emitter-base formation region formed in a self-aligned manner. 62A is a base extraction electrode for the bipolar transistor 51 of polycrystalline silicon (polysilicon) that is p-doped. 63A is an insulator layer of TEOS or the like material formed on top of the electrode 62A. 64A, 64B, 64C, and 64D are insulator side-wall layers for the electrode 62A composed of TEOS or the like material. 65 is an emitter extraction opening that is formed in a manner of self-alignment with the side-walls layers 64B and 64C. 66 is an emitter extraction electrode formed of polysilicon that is n-doped. 67 is a collector

2 extraction electrode formed of polysilicon doped to n-type. 68 is a graft base region doped with impurities by a thermal annealing step through the electrode 62A. 69 is an active base region formed by a thermal annealing step. 70 is an emitter region formed, by a thermal annealing step performed through the electrode 66, in a manner of self-alignment with the side-wall layers 64B and 64C. 71 is a collector contact region formed by a thermal annealing step.

The structure of the PMOS transistor 52 is now explained. 55B is an n-type buried well region formed in the substrate 54 by an ion implant step. 56B is an n-type well region formed in the epitaxial layer. 60A is a first gate insulator layer formed by oxidation of a surface portion of the epitaxial layer. 62C is a first gate electrode formed of polysilicon doped to n-type. 63C is an insulator layer of TEOS or the like material formed on top of the electrode 62C. 64E is an insulator side-wall layer of TEOS or the like material for the electrode 62C. 72A is a first LDD (lightly doped drain) region that is formed in a manner of self-alignment with a side-surface of the electrode 62C. 73A is a first source-drain region that is formed in a manner of self-alignment with the side-wall layer 64E by means of an ion implant step.

The structure of the NMOS transistor 53 is now explained. 58 is a second p-type well region formed in the epitaxial layer in such a way as to extend to the substrate 54. 60B is a second gate insulator layer formed by oxidation of a surface portion of the epitaxial layer. 62D is a second gate electrode formed of polysilicon doped to n-type. 63D is an insulator layer of TEOS or the like material formed on top of the electrode 62D. 64G is an insulator side-wall layer for the electrode 62D. 72C is a second LDD region that is formed in a manner of self-alignment with a side-surface of the electrode 62D. 73C is a second source-drain region that is formed in a manner of self-alignment with the side-wall layer 64G by means of an ion implant step.

For example, in the PMOS transistor 52, the side-surface of the electrode 62C and the side-wall layer 64E act as a side-wall in order that an LDD structure, which is capable of suppressing generation of hot carriers which causes deterioration in performance, is achieved.

In the bipolar transistor 51, the side-wall layers 64B and 64C are formed and self-aligned in the same fabrication step as the side-wall layer 64E. As a result of such arrangement, the dimensions of the emitter region 70 are reduced thereby reducing junction capacitance. The distance between the electrode 62A and the emitter region 70 is made short to reduce base resistance. The high-frequency characteristics are improved.

The distance between the graft base region 68 and the emitter region 70 (hereinafter called the FIRST PARAMETER) is a key factor for both the value of base resistance and the carrier transit time affecting the way in which the bipolar transistor 51 operates. For example, the distance between the electrode 62C and the source-drain region 73A (hereinafter called the SECOND PARAMETER) is a key factor for both the resistance to hot carriers and the saturation drain current value affecting the way in which the PMOS transistor 52 operates.

The above-described SIC apparatus, however, has some disadvantages. For example, FIRST and SECOND PARAMETERS are determined by the thickness of the side-wall layer 64B and the thickness of the side-wall layer 64E. It is extremely difficult to determine both the thickness of the side-wall layer 64B and the thickness of the side-wall layer 64E in a single fabrication step for optimization of operating characteristics. Conventionally, in order to guarantee the performance of the PMOS transistor 52, the side-wall layer 64E which determines an LDD structure tends to be optimized in preference to the side-wall layer 64B. Therefore, it is difficult to secure a sufficient fabrication processing margin.

Further, in the bipolar transistor 51, the thick side-wall layers 64B and 64C are formed around the perimeter of the emitter-base junction. As a result, when the side-wall layers 64B, 64C, the thermal capacity of which is great, cool down, resulting contraction stress is applied to the perimeter of the emitter-base junction. This causes a deterioration in emitter-base leakage characteristic. Additionally, when the emitter width becomes narrow because of the miniaturization, the aspect ratio of the opening 65 (the ratio of the opening's 65 height to its diameter) increases. This results in increase in the emitter resistance.

SUMMARY OF THE INVENTION

Bearing in mind the above-noted problems with the prior art technique, the present invention was made. Therefore, an object of this invention is to provide an improved SIC apparatus. More specifically, the operating characteristics of bipolar and MOS transistors are optimized individually, the leakage characteristic between emitter and base is improved, and the emitter resistance of the emitter extraction electrode is reduced.

In accordance with the present invention, a first side-wall layer for the base extraction electrode and a second side-wall layer for the gate electrode are formed by different fabrication steps, and the first side-wall layer is composed of an insulator layer and a conductor layer while the second side-wall layer is composed of an insulator layer.

The present invention provides an SIC apparatus. This SIC apparatus comprises:
(a) a bipolar transistor formed on a substrate of semiconductor material;
(b) a MOS transistor formed on the semiconductor substrate;
  the bipolar transistor including:
    (a-1) a base extraction electrode;
    the base extraction electrode being associated with a graft base region around a base region;
    the base extraction electrode being overlaid with a first insulator layer, and having at a side-surface thereof a first side-wall layer;
    (a-2) an emitter region;
    the emitter region being formed in a manner of self-alignment with the first side-wall layer;
    (a-3) an emitter extraction electrode;
  the MOS transistor including:
    (b-1) a gate electrode;
    the gate electrode being overlaid with a second insulator layer, and having at a side-surface thereof a second side-wall layer;
    (b-2) a source-drain region;
    the source-drain region being formed in a manner of self-alignment with the second side-wall layer;
wherein:
  the first side-wall layer is formed by lamination of a third insulator layer formed on the side-surface of the base extraction electrode and a conductor layer overlying the third insulator layer;
  the second side-wall layer is composed of a fourth insulator layer that is formed together with the third insulator layer in a single fabrication step.

In accordance with the above-described SIC apparatus, the first side-wall layer of the bipolar transistor, which has conventionally been formed of a thick insulator layer, is made up of the thin insulator layer and the conductor layer. As a result of such arrangement, the thermal capacity of the first side-wall layer is reduced and less contraction stress is applied to around the perimeter of the emitter-base junction. The diameter of the emitter extraction opening increases because the conductor layer of the first side-wall layer and the emitter extraction electrode become an integral part, and hence the aspect ratio of the opening decreases. The emitter resistance of the emitter extraction electrode is reduced.

Additionally, it is possible that the first side-wall layer and the second side-wall layer are formed in different fabrication steps. Accordingly, the distance between the graft base region and the emitter region can be controlled independently of the distance between the gate electrode and the source-drain region and both the distances can be optimized separately.

Further, the first side-wall layer is made up of the thin insulator layer and the conductor layer. As a result of such arrangement, less contraction stress is applied by the insulator layer to around the perimeter of the emitter-base junction. Deterioration in characteristic such as the leakage between emitter and base can be avoided.

It is preferable that the second side-wall layer is formed by lamination of the fourth insulator layer formed on the side-surface of the gate electrode and a fifth insulator layer overlying the fourth insulator layer. As a result of such arrangement, the distance between the graft base region and the emitter region of the bipolar transistor can be controlled independently of the distance between the gate electrode and the source-drain region of the MOS transistor, with greater latitude.

As the third insulator layer, which is formed together with the fourth insulator layer in a single fabrication step, becomes thin, the conductor layer becomes thick. As a result, deterioration in characteristic such as the leakage between emitter and base can be further improved and emitter resistance is further reduced.

It is preferable that in the above-described SIC apparatus the fifth insulator layer is a layer of silicon oxide. This ensures that the fifth insulator layer is obtained.

It is preferable that in the above-described SIC apparatus the second side-wall layer is additionally formed at a different side-surface of the base electrode facing in such a direction that the base extraction electrode extends over a layer for isolation between devices which surrounds the graft base region. As a result of such arrangement, deterioration in characteristic (e.g., leakage between other conductor layers through the conductor layer, and increase in parasitic capacitance) can be prevented without increasing the number of fabrication steps.

It is preferable that in the above-described SIC apparatus the third insulator layer is formed by lamination of an oxide layer formed on the side-surface of the base extraction electrode and a silicon nitride layer overlying the oxide layer. As a result of such arrangement, it is ensured that the third insulator layer is obtained.

It is preferable that in the above-described SIC apparatus the conductor layer is a layer of polysilicon. As a result of such arrangement, it is ensured that the conductor layer is obtained.

The present invention provides a method of fabricating a semiconductor integrated circuit apparatus composed of a bipolar transistor and a MOS transistor formed on a single semiconductor substrate. This method comprises the following steps of:

(a) forming over the semiconductor substrate an isolation layer for insulating the bipolar and MOS transistors, and forming a gate insulator layer over device regions excluding the region where the isolation layer has already been formed;

(b) performing an etching step to strip the gate insulator layer from a region where the bipolar transistor is formed, and depositing a first conductor layer and a first insulator layer over the entirety of the semiconductor substrate;

(c) subjecting the first insulator layer and the first conductor layer to an etching step to form a base extraction electrode for the bipolar transistor, an insulator layer on top of the base extraction electrode, a gate electrode for the MOS transistor, and an insulator layer on top of the gate electrode;

(d) forming a second insulator layer on a side-surface of the base extraction electrode, on top of an emitter formation region surrounded by the base extraction electrode, and on a side-surface of the gate electrode, and depositing on the entirety of the semiconductor substrate a third insulator layer and a second conductor layer;

(e) subjecting the second conductor layer to an etching step to form on the side-surface of the base extraction electrode and on the side-surface of the gate electrode a first side-wall layer composed of the second insulator layer, the third insulator layer, and the second conductor layer;

(f) performing an etching step, in which the first side-wall layer serves as an etch mask, to remove the third and second insulator layers from the emitter formation region, for self-aligned formation of an opening for an emitter extraction electrode;

(g) depositing a third conductor layer on the entirety of the semiconductor substrate, selectively etching the third conductor layer to form above the opening said emitter extraction electrode, and performing an etching step to remove the second conductor layer of the first side-wall layer from other side-surfaces of the base extraction electrode except the side-surface thereof covered with the emitter extraction electrode, and from the side-surface of the gate electrode, to form a second side-wall layer;

(h) forming the source-drain formation region in a manner of self-alignment with the second side-wall layer.

In accordance with the above-described method, the first side-wall layer of the bipolar transistor, which has conventionally been formed of a thick insulator layer, is made up of the thin insulator layer and the conductor layer. As a result of such arrangement, the thermal capacity of the first side-wall layer is reduced and less contraction stress is applied to around the perimeter of the emitter-base junction. Deterioration in characteristic such as the leakage between emitter and base can be avoided.

The diameter of the emitter extraction opening increases because the conductor layer of the first side-wall layer and the emitter extraction electrode become an integral part, and hence the aspect ratio of the opening decreases. The emitter resistance of the emitter extraction electrode is reduced.

Additionally, it is possible that the first side-wall layer and the second side-wall layer are formed in different fabrication steps. Accordingly, the distance between the graft base region and the emitter region can be controlled independently of the distance between the gate electrode of and the source-drain region. The base resistance value and the carrier travelling time affecting the way in which bipolar transistors operate, and the resistance to hot carriers and the saturation drain current value affecting the way in which MOS transistors operate, are all optimized.

Further, the conductor layer of the first side-wall layer is formed at a side-surface facing in such a direction that the base extraction electrode extends over a layer for isolation between devices which surrounds the graft base region. As a result of such arrangement, deterioration in characteristic (e.g., leakage between other conductor layers through the conductor layer, and increase in parasitic capacitance) can be prevented without increasing the number of fabrication steps.

It is preferable that the above-described method further comprises, after the step (g), depositing a fourth insulator layer on the entirety of the semiconductor substrate, and subjecting the fourth insulator layer to an etching step to form on the side-surface of the gate electrode the second side-wall layer composed of the second insulator layer, the third insulator layer, and the fourth insulator layer.

The distance between graft base region and emitter region in a bipolar transistor can be adjusted independently of the distance between gate electrode and source-drain region, with greater latitude. As a result, FIRST and SECOND PARAMETERS can be further optimized.

Further, the third insulator layer can be made thin, as a result of which the first conductor layer becomes thick. Deterioration in characteristic such as the leakage between emitter and base can be reduced.

DETAILED DESCRIPTION OF THE INVENTION

Embodiment 1

Referring now to the accompanying drawing figures, a first preferred embodiment of this invention is described below.

Figure 1:
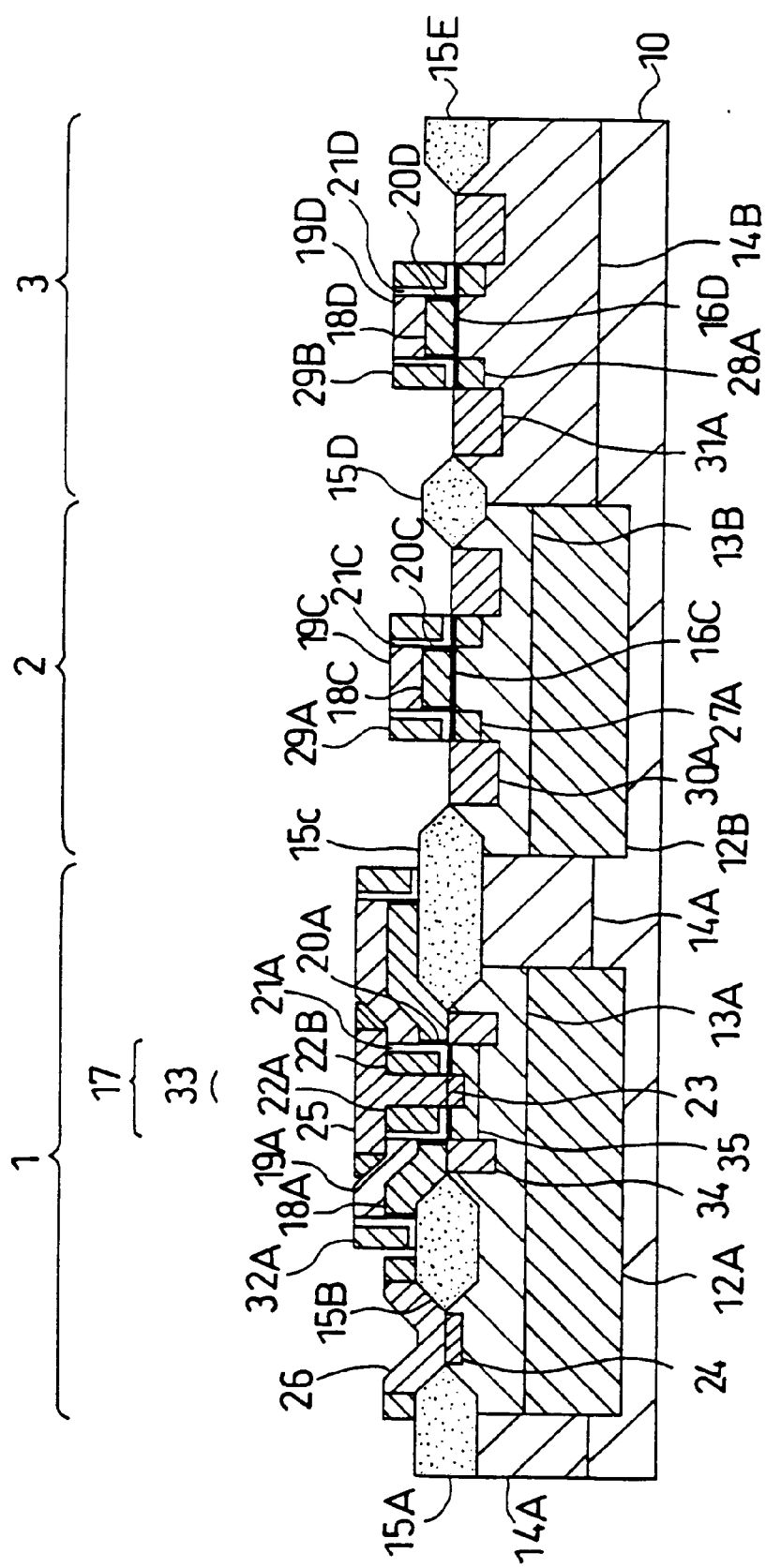
FIG. 1 is a cross-section of an SIC apparatus in accordance with a first embodiment of the present invention.
Figure 2:
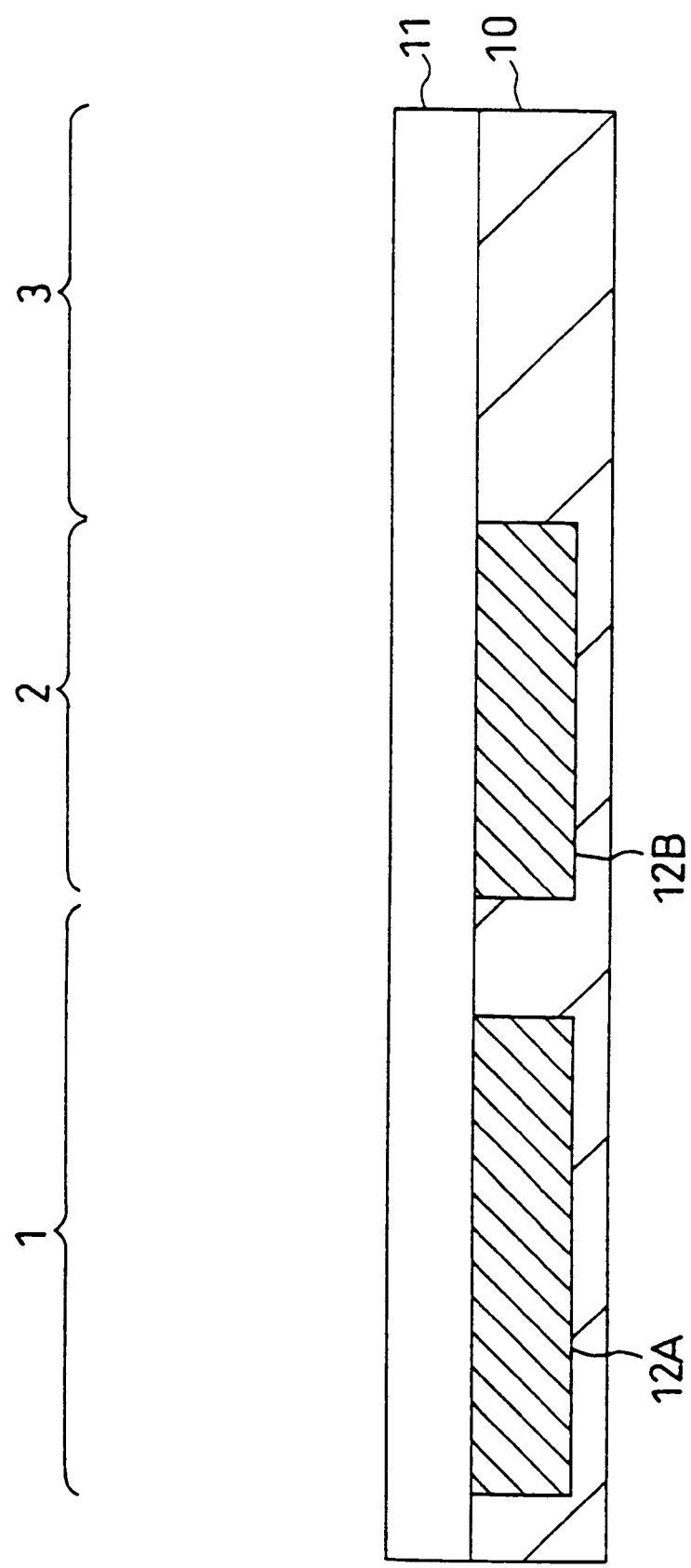
FIGS. 2–7 depict cross-sections of the fabrication of an SIC apparatus in accordance with a second embodiment of the present invention.

Referring first to FIG. 1, there is shown the structure of an SIC apparatus made in accordance with the first embodiment. 10 is a p-type semiconductor substrate of silicon. 1 indicates an npn bipolar transistor formed on the silicon substrate 10. 2 indicates a p-channel MOS (PMOS) transistor formed on the silicon substrate 10. 3 indicates an n-channel MOS (NMOS) transistor formed on the silicon substrate 10. 14A is a region for isolation between devices. The isolator region 14A is formed as follows. A portion of an epitaxial layer of an n-type semiconductor material deposited on the entire surface of the silicon substrate 10, is subjected to an ion implant step and a thermal annealing step, to form the isolator region 14A in such a way that the isolator region 14A extends down to the silicon substrate 10. 14B is a p-type well region. The p-well region 14B is formed as follows. A portion of the n-epitaxial layer deposited on the silicon substrate 10 is subjected to an ion implant step and a thermal annealing step, to form the p-well region 14B in such a way that the p-well region 14B extends down to the silicon substrate 10. 15A–E are LOCOS layers for isolation between devices. The npn bipolar transistor 1, the PMOS transistor 2, and the NMOS transistor 3 are described in detail.

The npn bipolar transistor 1 is first described with reference to FIG. 1. 12A is an n-type buried collector region formed in the silicon substrate 10 by means of ion implant and thermal annealing. 13A is an n-type collector region formed by subjecting a portion of the n-epitaxial layer deposited on the entirety of the silicon substrate 10 to an ion implant step and a thermal annealing step. 17 is an emitter-base formation region formed in a self-aligned manner. 18A is a base extraction electrode for the npn bipolar transistor 1. The electrode 18A is composed of p-doped polysilicon. 19A is an insulator layer formed on top of the electrode 18A. The insulator layer 19A is formed of TEOS or the like material. 20A is an oxide layer formed at a side-surface of the electrode 18A by means of thermal oxidation. 21A is a silicon nitride layer deposited over the side-surface of the electrode 18A by means of an LPCVD (low-pressure chemical vapor deposit) step and an etching step. 22A and 22B are polysilicon layers deposited by means of an LPCVD step and an etching step on the side-surfaces of the electrodes 18A, 18A, respectively. 23 is an emitter region formed in a manner of self-alignment with the polysilicon layers 22A, 22B by means of a thermal annealing step carried out through an emitter extraction electrode 25. 24 is a collector contact region formed by means of a thermal annealing step. The emitter extraction electrode 25 is composed of n-doped polysilicon. 26 is a collector extraction electrode composed of n-doped polysilicon. 32A is an insulator side-wall layer for the electrode 18A composed of TEOS or the like material. 33 is an emitter extraction opening formed in a manner of self-alignment with the layers 22A, 22B. 34 is a graft base region that is doped, through the electrode 18A, with impurities by means of a thermal annealing step. 35 is an active base formed by means of a thermal annealing step.

The structure of the PMOS transistor 2 is now described. 12B is an n-type buried well region formed in the silicon substrate 10 by means of an ion implant step. 13B is an n-type well region formed by subjecting the n-epitaxial layer deposited on the silicon substrate 10 to an ion implant step and a thermal annealing step. 16C is a first gate insulator layer formed by means of oxidation of a surface portion of the epitaxial layer. 18C is a first gate electrode formed of n-doped polysilicon. 19C is an insulator layer of TEOS or the like material overlying the electrode 18C. 20C is an oxide layer formed at a side-surface of the electrode 18C by means of thermal oxidation. 21C is a silicon nitride layer formed at the side-surface of the electrode 18C by means of LPCVD and etching. 27A is a first LDD (lightly doped drain) region formed by having the silicon nitride layer 21C serve as a side-wall. 29A is an insulator side-wall layer for the electrode 18C formed of TEOS or the like material. 30A is a first source-drain region formed by means of ion implant in a manner of self-alignment with the side-wall layer 29A serving as an ion implant side-wall.

The structure of the NMOS transistor 3 is now described. 14B is a second p-type well region that is formed by subjecting the n-epitaxial layer to an ion implant step and a thermal annealing step of the epitaxial layer, so that the p-well region 14B extends down to the silicon substrate 10. 16D is a second gate insulator layer formed by oxidation of a surface portion of the epitaxial layer. 18D is a second gate electrode formed of n-doped polysilicon. 19D is an insulator layer of TEOS or the like material overlying the electrode 18D. 20D is an oxide layer formed at a side-surface of the electrode 18D by means of thermal oxidation. 21D is a silicon nitride layer formed by means of LPCVD and etching at the side-surface of the electrode 18D. 28A is a second LDD region formed by having the silicon nitride layer 21D serve as a side-wall. 29B is an insulator side-wall layer for the electrode 18D formed of TEOS or the like material. 31A is a second source-drain region that is formed by means of ion implant in a manner of self-alignment with the side-wall layer 29B serving as an ion implant side-wall.

The silicon substrate 10 is a boron-doped, (100)-plane silicon the resistivity of which is about 10 $\Omega \cdot$cm. The npn bipolar transistor 1, the PMOS transistor 2, and the NMOS transistor 3 are formed on the silicon substrate 10.

The buried collector region 12A of the npn bipolar transistor 1 is formed by an impurity implant with arsenic or antimony. The junction depth and sheet resistivity of the collector region 12A are 1–2 $\mu$m and 50–150 $\Omega/\square$, respectively. The buried n-well region 12B of the PMOS transistor 2 is likewise formed by an impurity implant with arsenic or antimony. The junction depth and sheet resistivity of the n-well region 12B are 1–2 $\mu$m and 50–150 $\Omega/\square$. The formation of the buried n-well region 12B improves breakdown voltage between the drain-source region 3 of the npn bipolar transistor 1 and the silicon substrate 10.

Impurities of arsenic or phosphorus are introduced onto the entire surface of the silicon substrate 10 to deposit the n-type epitaxial layer having a film thickness in the range of 0.8 to 1.5 $\mu$m and a resistivity in the range of 1 to 5 $\Omega \cdot$cm. The film thickness of the epitaxial layer is defined by a region in the vertical direction of the n-collector region 13A and the n-well region 13B. The n-collector region 13A is formed as follows. Phosphorus is introduced to form the collector region 13A in the epitaxial layer such that the collector region 13A extends to the n-collector region 12A of the npn bipolar transistor 1. The junction depth and surface concentration of the collector region 13A are 0.8–1.5 $\mu$m and about 5×10$^{16}$ cm$^{-3}$, respectively. The collector region 13B is formed as follows. Phosphorus is introduced to form the collector region 13B in the epitaxial layer such that the collector region 13B extends to the n-well region 12B of the PMOS transistor 2. The junction depth and surface concentration of the collector region 13B are 0.8–1.5 $\mu$m and about 5×10$^{16}$ cm$^{-3}$, respectively.

The epitaxial layer thickness and the impurity concentration of both the n-collector region 12A and the n-well region 13B are key parameters which determine not only device breakdown voltage, carrier transit time, and the base junction capacitance of the npn bipolar transistor 1, but also component performance such as device breakdown voltage and the source-drain junction capacitance of the PMOS transistor 2, and they are optimized by the foregoing conditions.

The isolator region 14A is formed as follows. Boron is introduced into the epitaxial layer to form the isolator region 14A such that the isolator region 14A extends to the silicon substrate 10 within a region for isolation between devices of the npn bipolar transistor 1. The junction depth and surface concentration of the isolator region 14A are 1.2–2.0 $\mu$m and about 7×10$^{16}$ cm$^{-3}$, respectively. The p-well region 14B is formed as follows. Boron is introduced into the epitaxial layer to form the p-well region 14B such that the p-well region 14B extends to the silicon substrate 10. The junction depth and surface concentration of the p-well region 14B are 1.2–2.0 $\mu$m and about 7×10$^{16}$ cm$^{-3}$, respectively.

The junction depth and impurity concentration of both the isolator region 14A and the p-well region 14B determine not only device breakdown voltage and component performance of the NMOS transistor 3 but also the device isolation breakdown voltage of the npn bipolar transistor 1. Therefore, when the junction depth and impurity concentration of both the isolator region 14A and the n-well region 14B are insufficient, breakdown voltage between the collector region 12A and the n-well region 12B becomes poor.

The LOCOS layers 15A, 15C, 15D, and 15E are layers for isolation between devices, are formed in respective device isolation regions of the npn bipolar transistor 1, the PMOS transistor 2, and the NMOS transistor 3 by means of selective oxidation, each LOCOS layer having a film thickness in the range of 400 to 800 nanometers. The LOCOS layer 15B is a layer for isolation between devices, is formed in a base-collector electrode extraction portion region by means of selective oxidation, and has a film thickness in the range of 400 to 800 nanometers.

If the LOCOS layer 15B is thin, this results in increase in parasitic capacitance between base and collector of the npn bipolar transistor 1. If the LOCOS layer 15D is thin, this results in decrease in device isolation breakdown voltage between the PMOS transistor 2 and the NMOS transistor 3. If the LOCOS layer 15 is thick, a great step is created at end.

The first gate oxide layer 16C is an insulator layer which has a film thickness of about 10 nanometers and which is formed on a surface portion of the epitaxial layer of the PMOS transistor 2 by means of pyrogenic oxidation. The second gate oxide layer 16D is an insulator layer which has a film thickness of about 10 nanometers and which is formed on a surface portion of the epitaxial layer of the NMOS transistor 3 by means of pyrogenic oxidation.

The electrode 18A is formed as follows. A polysilicon layer is deposited having a film thickness in the range of 300 to 400 nanometers so that one end of the electrode 18A is bound to the graft base region 34 and the other end extends over the LOCOS layer 15B or 15C. Subsequently, boron as a p-type impurity material is introduced to such an extent that the sheet resistivity is 100–200 Ω/□, and an etching step is carried out to form the electrode 18A.

The electrodes 18C and 18D are formed as follows. Polysilicon is deposited having a film thickness in the range of 300 to 400 nanometers. Phosphorus or arsenic as an n-type impurity material is introduced to such an extent that the sheet resistivity is 20–40 Ω/□. An etching step is carried out to form the electrodes 18C, 18D.

Each of the insulator layer 19A on top of the electrode 18A, the insulator layer 19C on top of the electrode 18C, and the insulator layer 19D on top of the electrode 18D, is formed as follows. TEOS or the like material is deposited on each electrode 18A, 18C, 18D having a film thickness in the range of 120 to 250 nanometers, and an etching step is carried out.

In the PMOS transistor 2, because of a side-wall surface which has a thickness in the range of 100 to 200 nanometers and which is made up of the oxide layer 20C, the silicon nitride layer 21C, and the layer 29A, the source-drain region 30A is formed in a manner of self-alignment with the electrode 18C.

The source-drain region 30A is formed by means of an ion implant step with boron. The junction depth and surface concentration of the region 30A are about 0.2 μm and about $1 \times 10^{20}$ cm$^{-3}$, respectively. The LDD region 27A is formed by means of an ion implant step with boron using the silicon nitride layer 21C as an implant side-wall. The surface concentration and junction depth of the LDD region 27A are about $1 \times 10^{18}$ cm$^{-3}$ and about 0.2 μm, respectively.

In the NMOS transistor 3, because of a side-wall which has a thickness in the range of 100 to 200 nanometers and which is made up of the oxide layer 20D, the silicon nitride layer 21D, and the layer 29B, the second source-drain region 31A is formed in a manner of self-alignment with the electrode 18D.

The source-drain region 31A is formed by an ion implant step with arsenic. The junction depth and surface concentration of the region 31A are about 0.1 μm and about $1 \times 10^{20}$ cm$^{-3}$, respectively. The LDD region 28A is formed by an ion implant step with phosphorus using the silicon nitride layer 21D as an implant side-wall. The junction depth and surface concentration of the LDD region 28A are about 0.2 μm and about $1 \times 10^{18}$ cm$^{-3}$, respectively.

Because of these LDD structures, hot carrier resistance is improved, and by optimizing the thicknesses of the side-wall surfaces 29A and 29B to 100–200 nanometers, device characteristics such as hot carrier resistance and the value of saturation drain current become good.

In the npn bipolar transistor 1, the opening 33 is formed in a manner of self-alignment with a side-wall which has a thickness in the range of 200 to 300 nanometers and which is made up of the oxide layer 20A having a thickness in the range of 15 to 30 nanometers, the silicon nitride layer 21A having a thickness of 40 to 80 nanometers, and the polysilicon layer 22A having a thickness of about 200 nanometers.

Each of the electrodes 25 and 26 is formed as follows. An ion implant with ions of arsenic is carried out to such an extent that the film thickness is 150–300 nanometers and the sheet resistivity is 150–300 Ω/□.

The graft base region 34 is formed as follows. Boron is introduced through the electrode 18A and, as a result, the graft base region 34, the junction depth and surface concentration of which are 0.2–0.4 μm and $1 \times 10^{20}$ cm$^{-3}$ to $3 \times 10^{20}$ cm$^{-3}$, respectively, is formed.

The base region 35 is formed as follows. Boron is introduced and, as a result, the base region 35, the junction depth and surface concentration of which are 0.15–0.25 μm and $1 \times 10^{19}$ cm$^{-3}$ to $3 \times 10^{19}$ cm$^{-3}$, respectively, is formed.

The emitter region 23 is formed as follows. Arsenic is introduced through the electrode 25A, and, as a result, the region 23, the junction depth and surface concentration of which are 0.05–0.1 μm and $1 \times 10^{20}$ cm$^{-3}$ to $3 \times 10^{20}$ cm$^{-3}$, respectively, is formed.

The collector contact region 24 is formed as follows. Arsenic is introduced through the electrode 26 and, as a result, the collector contact region 24, the junction depth and surface concentration of which are 0.05 to 0.1 μm and $1 \times 10^{20}$ cm$^{-3}$ to $3 \times 10^{20}$ cm$^{-3}$, respectively, is formed.

As described above, the oxide layer 20A, the silicon nitride layer 21A, and the polysilicon layer 22A together form the aforesaid side-wall layer. Because of such side-wall layer formation, the opening 33 and the emitter region 23 are formed in a manner of self-alignment with the electrode 18A and the graft base region 34, and the oxide layer 20A and the silicon nitride layer 21A act as insulator layers for electrical isolation between the electrode 18A and the emitter extraction electrode 25.

In accordance with the present embodiment, the electrode 18A has on its side-surface an insulator layer made up of two thin layers and, as a result, contraction stress by the insulator layer applied to around the perimeter of the emitter-base junction is reduced, whereupon emitter-base leakage becomes controllable. Additionally, the side-surface of the electrode 18A in contact with the electrode 25 is formed of polysilicon which is a conductor, whereupon the opening 33 comes to have a greater diameter, in other words the aspect ratio of the opening 33 (the ratio of the opening's 33 height to its diameter) decreases. As a result, the emitter resistance of the electrode 25 of polysilicon decreases.

Further, if a layer of polysilicon, which is formed, by the same fabrication step as the layer 22A, on the side-surface of the electrode 18A extending towards the LOCOS layer 15B, is not stripped, this produces the problem that leakage between other conductor layers may occur through such a polysilicon layer or the problem that parasitic capacitance increases, therefore leading to deterioration in the characteristics of the npn bipolar transistor 1. Such an unstripped polysilicon layer, however, is removed during a fabrication step for forming the insulator side-wall layer 29A. Accordingly, such a problem can be avoided without increase in the number of fabrication steps.

If the side-wall layer, made up of three layers, of the electrode 18A is thick, this results in an increase in the base resistance. On the other hand, if such a side-wall layer is thin, this results in an increase in the carrier transit time that has an effect on the heavily-doped graft base region 34. As described above, the thickness of the side-wall layer as a result of lamination of three layers, which determines FIRST PARAMETER of the bipolar transistor 1, is optimized to 200–300 nanometers. The thickness of the side-wall layers of the electrodes 18C and 18D, which determines SECOND PARAMETER, is optimized to 100–200 nanometers. In other words, the thickness of the bipolar transistor's 1 side-wall layer can be optimized independently of the thickness of the transistors' 2 and 3 side-wall layers, with advantages.

Embodiment 2

Referring now to the accompanying drawing figures, a second preferred embodiment of this invention is described below.

FIGS. 2–7 depict schematic cross-sections of a semiconductor substrate at different stages of the fabrication of an SIC apparatus in accordance with the second embodiment of the present invention. 10 is a p-type semiconductor substrate of silicon. The semiconductor substrate 10 is overlaid with an epitaxial layer of an n-type semiconductor material. 1 is an npn bipolar transistor. 2 is a PMOS transistor. 3 is an NMOS transistor. 12A is an n-type buried collector region for the npn bipolar transistor 1 and is formed in an upper portion of the silicon substrate 10. 12B is an n-type buried well region for the PMOS transistor 2 and is formed in an upper portion of the silicon substrate 10.

The silicon substrate 10 is a boron-doped, (100)-plane silicon having a resistivity of about 10 Ω·cm. The npn bipolar transistor 1, the PMOS transistor 2, and the NMOS transistor 3 are formed over the silicon substrate 10.

A photolithography step is carried out to pattern a layer of photoresist applied onto the surface of the silicon substrate 10, to open windows at predetermined locations where the npn bipolar transistor 1 and the PMOS transistor 2 are formed. Ions of arsenic or antimony are implanted through the photoresist pattern serving as a mask against ion implantation to the silicon substrate 10 at a dose and implant energy of about $1 \times 10^{15}$ cm$^{-2}$ and 40–60 KeV, respectively.

The photoresist mask is stripped off the silicon substrate 10 by oxygen-plasma ashing. A thermal annealing step is carried out at a temperature in the range of 1150 to 1200 degrees centigrade for about 15–30 minutes. As a result, the n-collector region 12A and the n-well region 12B, the junction depth and sheet resistivity of which are 1–2 μm and 50–150 Ω/□, respectively, are formed.

An n-type epitaxial layer 11 is deposited on the silicon substrate 10, having a film thickness in the range of 0.8 to 1.5 μm and a resistivity of 1–5 Ω·cm by impurities such as arsenic and phosphorus. More specifically, the epitaxial layer 11 is deposited at 1050 degrees centigrade at about 80×133.322 Pa using a mixture of dichlorsilane and arsine.

Figure 3:
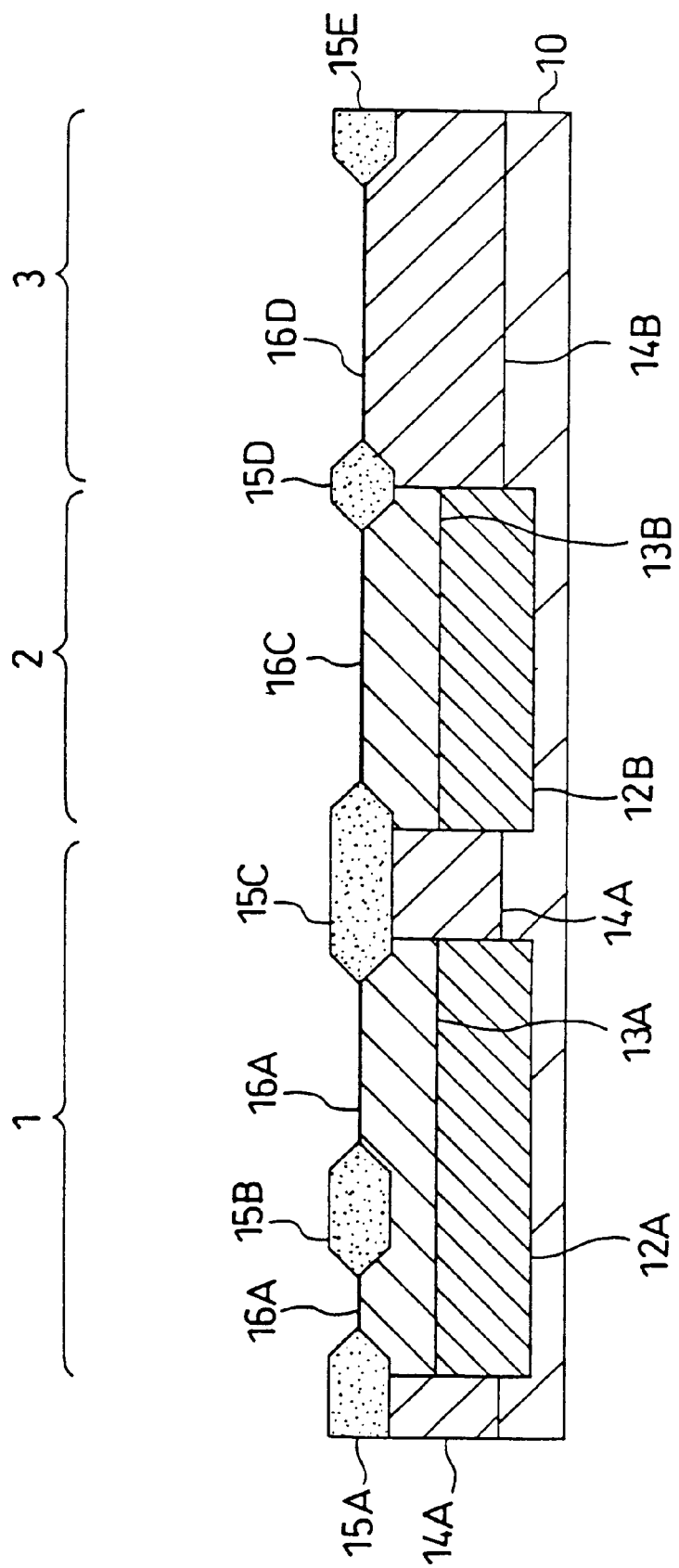

FIG. 3 is now described. 13A is an n-type collector region formed at an upper portion of the epitaxial layer 11. 13B is an n-type well region formed at an upper portion of the epitaxial layer 11. 14A is an isolator region for isolation between devices. The isolator region 14A is formed at an upper portion of the epitaxial layer 11 such that the region 14A extends to the silicon substrate 10. 14B is a p-type well region for the NMOS transistor 3. The p-well region 14B is formed at an upper portion of the epitaxial layer 11 such that the region 14B extends to the silicon substrate 10. 15A–15E are LOCOS layers for providing isolation between devices. 16A is an insulator layer formed by means of oxidation of a surface portion of the epitaxial layer 11. 16C is a first gate insulator layer for the PMOS transistor 2 and is formed by means of oxidation of a surface portion of the epitaxial layer 11. 16D is a second gate insulator layer for the NMOS transistor 3 formed by means of oxidation of a surface portion of the epitaxial layer 11.

A photolithography step is carried out to pattern a layer of photoresist applied onto the surface of the epitaxial layer 11, so that windows are opened at predetermined locations where the npn bipolar transistor 1 and the PMOS transistor 2 are formed. Through such a photoresist pattern acting as a mask against ion implantation, an ion implant step with ions of phosphorus is carried out to the epitaxial layer 11 at a dose and implant energy of about $1 \times 10^{13}$ cm$^{-2}$ and about 100 KeV, respectively.

The photoresist mask is stripped from the silicon substrate 10 by means of oxygen-plasma ashing. A photolithography step is carried out to pattern a layer of photoresist applied, so that windows are opened at predetermined locations where a device isolation region for the npn bipolar transistor 1 and the NMOS transistor 3 are formed. Thorough such a photoresist layer serving as a mask against ion implantation, an ion implant step with ions of boron is carried out at a dose and implant energy of $1 \times 10^{13}$ cm$^{-2}$ to $2 \times 10^{13}$ cm$^{-2}$ and about 20 KeV respectively. The photoresist mask is stripped from the silicon substrate 10 by means of oxygen-plasma ashing, and a thermal annealing step is carried out in an atmosphere of nitrogen at about 1100 degrees centigrade for 90–150 minutes.

As a result of such processing, the n-collector region 13A, the diffusion depth and surface concentration of which are 0.8–1.5 μm and about $5 \times 10^{16}$ cm$^{-3}$, respectively, is formed extending to the n-collector region 12A of the npn bipolar transistor 1. The n-well region 13B, the diffusion depth and surface concentration of which are 0.8–1.5 μm and about $5 \times 10^{16}$ cm$^{-3}$, respectively, is formed extending to the n-well region 12B. The isolator region 14A, the diffusion depth and surface concentration of which are 1.2–2.0 μm and about $7 \times 10^{16}$ cm$^{-3}$, respectively, is formed at the device isolation region extending to the silicon substrate 10. The p-well region 14B, the diffusion depth and surface concentration of which are 1.2–2.0 μm and about $7 \times 10^{16}$ cm$^{-3}$, respectively, is formed extending to the silicon substrate 10.

A silicon nitride layer is formed at the surface of the epitaxial layer 11. This silicon nitride layer acts as a selective mask at the time of forming the LOCOS layers. The silicon nitride layer is deposited by means of an LPCVD step in which a mixture of dichlorsilane and arsine is employed, having a film thickness of about 120 nanometers. Subsequently, a layer of photoresist is applied onto the silicon nitride layer, and a photolithography step is carried out to pattern the photoresist layer for formation of device isolator regions for the transistors 1, 2, 3, and an isolator region for the bipolar transistor's 1 base collector electrode extraction portion. Thereafter, a dry etching step is carried out using a mixture of flon and a gas of the bromine family for selective removal of the silicon nitride layer from over the isolator regions, through the photoresist pattern serving as an etch mask. The photoresist mask is stripped from the silicon substrate 10 by means of oxygen-plasma ashing. Subsequently, a pyrogenic oxidation step is carried out at about 1050 degrees centigrade for about 60 minutes, to form the LOCOS layers 15A–E each of which has a film thickness in the range of 400 to 800 nanometers.

The silicon nitride layer is removed using a solution of phosphoric acid. Subsequently, a photolithography step is carried out to pattern a layer of photoresist applied, so that a window is opened at a predetermined location where the PMOS transistor 2 is formed. Through such a photoresist pattern acting as a mask against ion implantation, an ion implant with ions of boron is carried out at a dose and implant energy of about $4 \times 10^{12}$ cm$^{-2}$ and about 20 KeV, respectively, for the purpose of controlling the threshold voltage of the PMOS transistor 2. The photoresist mask is stripped from the silicon substrate 10 by means of oxygen-plasma ashing. Likewise, a photolithography step is carried out to pattern a layer of photoresist applied, so that a window is opened at a predetermined location where the NMOS transistor 3 is formed. Through such a photoresist pattern serving as a mask against ion implantation, an ion implant with ions of boron is carried out at a dose and implant energy of about $3 \times 10^{12}$ cm$^{-2}$ and about 40 KeV, respectively, for the purpose of controlling the threshold voltage of the NMOS transistor 3. As a result of the ion implant steps for control of the threshold voltages, the threshold voltage of the PMOS transistor 2 is held from—0.5 to—0.8 V and the threshold voltage of the NMOS transistor 3 is held from 0.5 to 0.8 V.

The photoresist mask is stripped from the silicon substrate 10 by means of oxygen-plasma ashing. Subsequently, the entire surface of the epitaxial layer 11 is subjected to a pyrogenic oxidation step at about 900 degrees centigrade for about 30 minutes, whereupon the insulator layer 16A, the first gate insulator layer 16C, and the second gate insulator layer 16D, each of which has a film thickness of about 10 nanometers, are formed.

Figure 4:
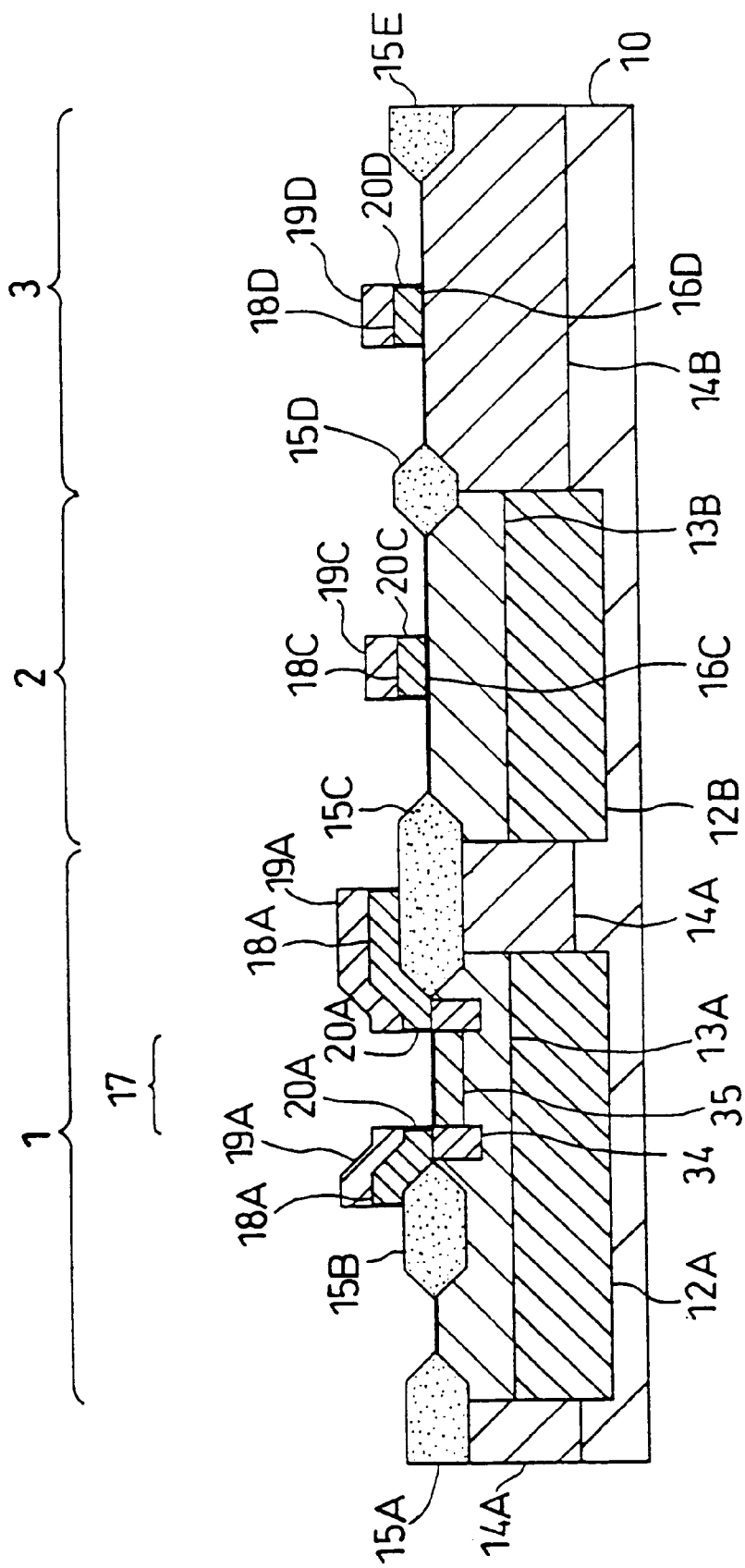

FIG. 4 is now described. 17 is an emitter-base formation region that is formed in a self-aligned manner. 18A is a base extraction electrode of polysilicon for the npn bipolar transistor 1. 18C is a first gate electrode of polysilicon for the PMOS transistor 2. 18D is a second gate electrode of polysilicon for the NMOS transistor 3. 19A is a TEOS insulator layer on top of the electrode 18A. 19C is a TEOS insulator layer on top of the electrode 18C. 19D is a TEOS insulator layer on top of the electrode 18D. 20A is an oxide layer formed at a side-surface of the electrode 18A of the npn bipolar transistor 1 by thermal oxidation. 20C is an oxide layer formed at a side-surface of the electrode 18C of the PMOS transistor 2 by thermal oxidation. 20D is an oxide layer formed at a side-surface of the electrode 18D of the NMOS transistor 3 by thermal oxidation. 34 is a graft base region for the npn bipolar transistor 1. 35 is an active base region for the npn bipolar transistor 1.

An etching step, which uses a photoresist mask produced by photolithography as an etch mask and which uses a mixture of ammonium fluoride and hydrofluoric acid, is carried out to selectively etch away the insulator layer 16A of the npn bipolar transistor 1.

The photoresist mask is stripped from the silicon substrate 10 by means of oxygen-plasma ashing. Subsequently, a layer of polysilicon is deposited 300–400 nanometers on the entire surface of the epitaxial layer 11 by an LPCVD step in which a silane gas is used, for formation of the electrodes of the transistors 1–3. Then, through a predetermined photoresist pattern for the npn bipolar transistor 1 serving as a mask against ion implantation, an ion implant with ions of boron is carried out at a dose in the range of $5 \times 10^{15}$ cm$^{-2}$ to $1 \times 10^{16}$ cm$^{-2}$ at an implant energy of about 40 KeV. Subsequently, an oxygen-plasma ashing step is carried out to strip the photoresist mask. Subsequently, through a predetermined photoresist pattern for the transistors 2 and 3 serving as a mask against ion implantation, an ion implant with ions of phosphorus is carried out at a dose in the range of $1.5 \times 10^{16}$ cm$^{-2}$ to $3 \times 10^{16}$ cm$^{-2}$ at an implant energy of about 40 KeV.

An oxygen-plasma ashing step is carried out to strip the photoresist mask. An LPCVD step, in which a mixture of TEOS and oxygen is employed, is carried out at about 700 degrees centigrade in order to deposit a 120- to 250-nm thick oxide layer on the entire surface of the previously deposited polysilicon layer. Subsequently, by using a predetermined photoresist pattern as a mask against dry etching, the oxide layer deposited is dry etched using a mixture of CHF$_3$, ammonia, and oxygen. Thereafter, the polysilicon layer deposited is etched anisotropically using a mixture of SF$_6$, C$_2$, and ClF$_5$, to form the electrode 18A having a sheet resistivity in the range of 100 to 200 Ω/□, and the electrode 18C and the electrode 18D having a sheet resistivity in the range of 20 to 40 Ω/□. The insulator layers 19A, 19C, 19D each having a film thickness in the range of 120 to 250 nanometers are formed on the electrodes 18A, 18C, 18D, respectively, and at the same time the emitter-base formation region 17 for the npn bipolar transistor 1 is opened.

The photoresist mask is removed by means of oxygen-plasma ashing. This is followed by a thermal annealing step at about 900 degrees centigrade for about 30 minutes in an atmosphere of oxygen, whereupon the oxide 20A layer is formed at the electrode's 18A side-surface, the oxide layer 20C is formed at the electrode's 18C side-surface, and the oxide layer 20D is formed at the electrode's 18D side-surface, each oxide layer 20A, 20C, 20D having a film thickness in the range of 15 to 30 nanometers.

A thermal annealing step is carried out at about 950 degrees centigrade for about 30 minutes in an atmosphere of nitrogen. This annealing step forces the boron impurities contained in the electrode 18A of the npn bipolar transistor 1 into the n-collector region 13A and, as a result, the graft, base region 34, the junction depth and surface concentration of which are 0.2–0.4 μm and $1 \times 10^{20}$ cm$^{-3}$ to $3 \times 10^{20}$ cm$^{-3}$, respectively, is formed.

Using a photoresist pattern by a photolithography step and the electrode 18A as a mask against ion implantation, an ion implant with ions of boron is carried out at a dose and implant energy of about $1 \times 10^{13}$ cm$^{-2}$ and about 10 KeV, respectively and, as a result, the active base region 35 is formed, having a junction depth in the range of 150 to 250 nanometers and a surface concentration in the range of $1 \times 10^{19}$ cm$^{-3}$ to $3 \times 10^{19}$ cm$^{-3}$. This is followed by removal of the photoresist mask by means of oxygen-plasma ashing.

Figure 5:
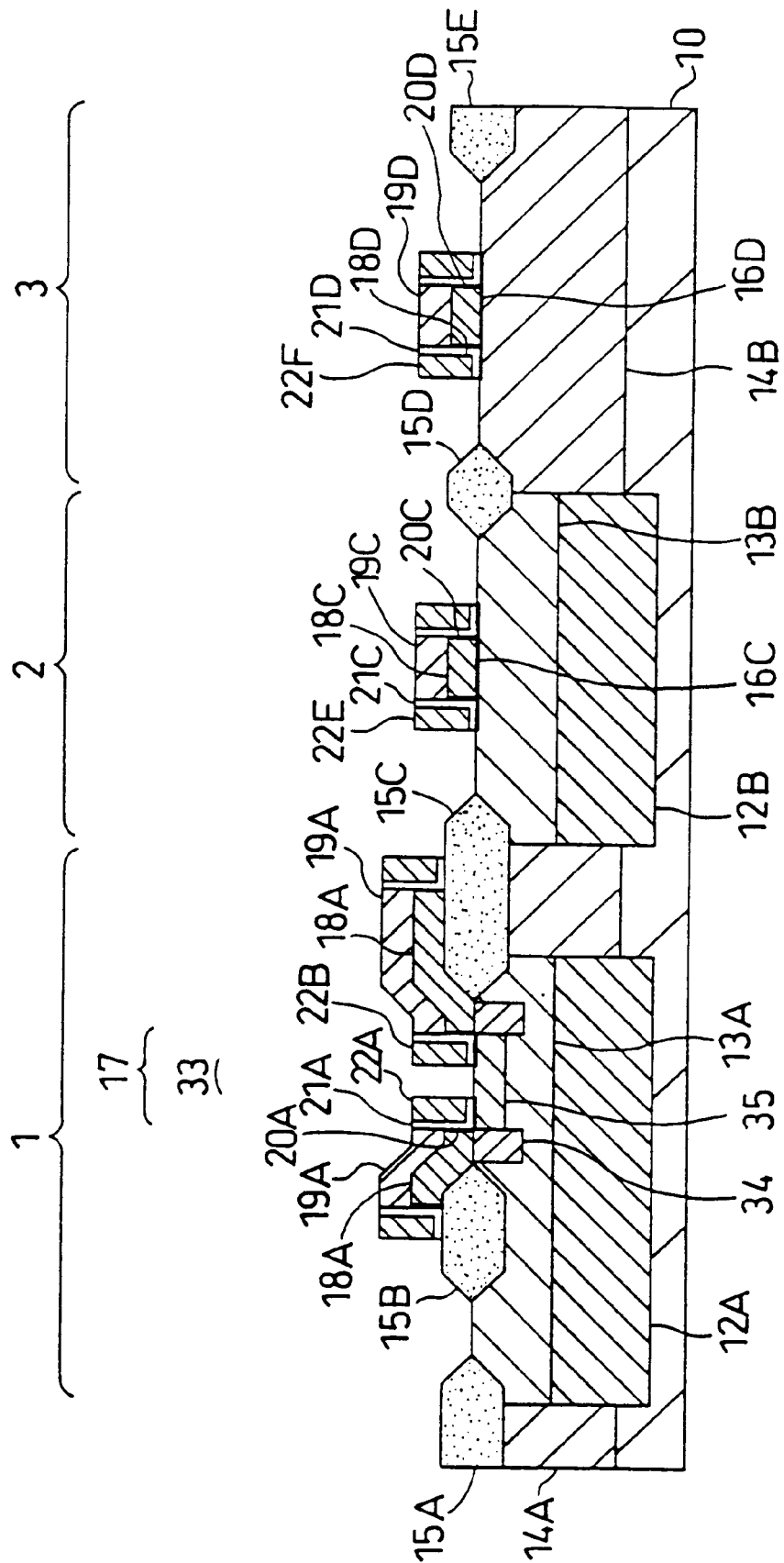

FIG. 5 is now described. 21A is a silicon nitride layer over the side-surface of the electrode 18A. 21C is a silicon nitride layer over the side-surface of the electrode 18C. 21D is a silicon nitride layer over the side-surface of the electrode LED. 22A and 22B are layers of polysilicon over the side-surfaces of the electrodes 18A, 18A. 22E is a layer of polysilicon over the side-surface of the electrode 18C. 22F is a layer of polysilicon over the side-surface of the electrode 18D. 33 is an emitter extraction opening which is formed in a manner of self-alignment with the layers 22A and 22B.

A silicon nitride layer is deposited over the entirety of the epitaxial layer 22 by means of an LPCVD step in which a mixture of dichlorsilane and arsine is used in order that insulator layers are formed on the side-surfaces of the electrodes 18A, 18C, 18D, each insulator layer having a film thickness in the range of 40 to 80 nanometers.

A layer of polysilicon is deposited about 200 nanometers on the silicon nitride layer for formation of side-wall layers for the electrodes 18A, 18C.

The polysilicon layer deposited is etched anisotropically using a mixture of $SF_6$ and $CCl_4$ so as to form the polysilicon layers 22A and 22B on the side-surfaces of the electrodes 18A, 18A, the polysilicon layer 22E on the side-surface of the electrode 18C, and the polysilicon layer 22F on the side-surface of the electrode 18D.

Using the polysilicon side-wall layers as masks against etching, an etching step is carried out using a mixture of flon and a gas of the bromine family, to form the silicon nitride layer 21A on the side-surface of the electrode 18A, the silicon nitride layer 21C on the side-surface of the electrode 18C, and the silicon nitride layer 21D on the side-surface of the electrode 18D.

An etching step, which uses a mixture of ammonium fluoride and hydrofluoric acid, is carried out to strip the oxide layer from the collector electrode formation region in the npn bipolar transistor 1, from the opening 33, and from the source and drain formation regions of the transistors 2, 3. As a result, a 200–300 nm thick side-wall layer, made up of three different layers (i.e., the oxide layer 20A, the silicon nitride layer 21A, and the polysilicon layer 22A), is formed and, at the same time, the opening 33 is formed in a self-aligned manner.

In accordance with the present embodiment, FIRST PARAMETER is determined by the aforesaid side-wall layer formed of the three layers 20A, 21A, 22A.

Figure 6:
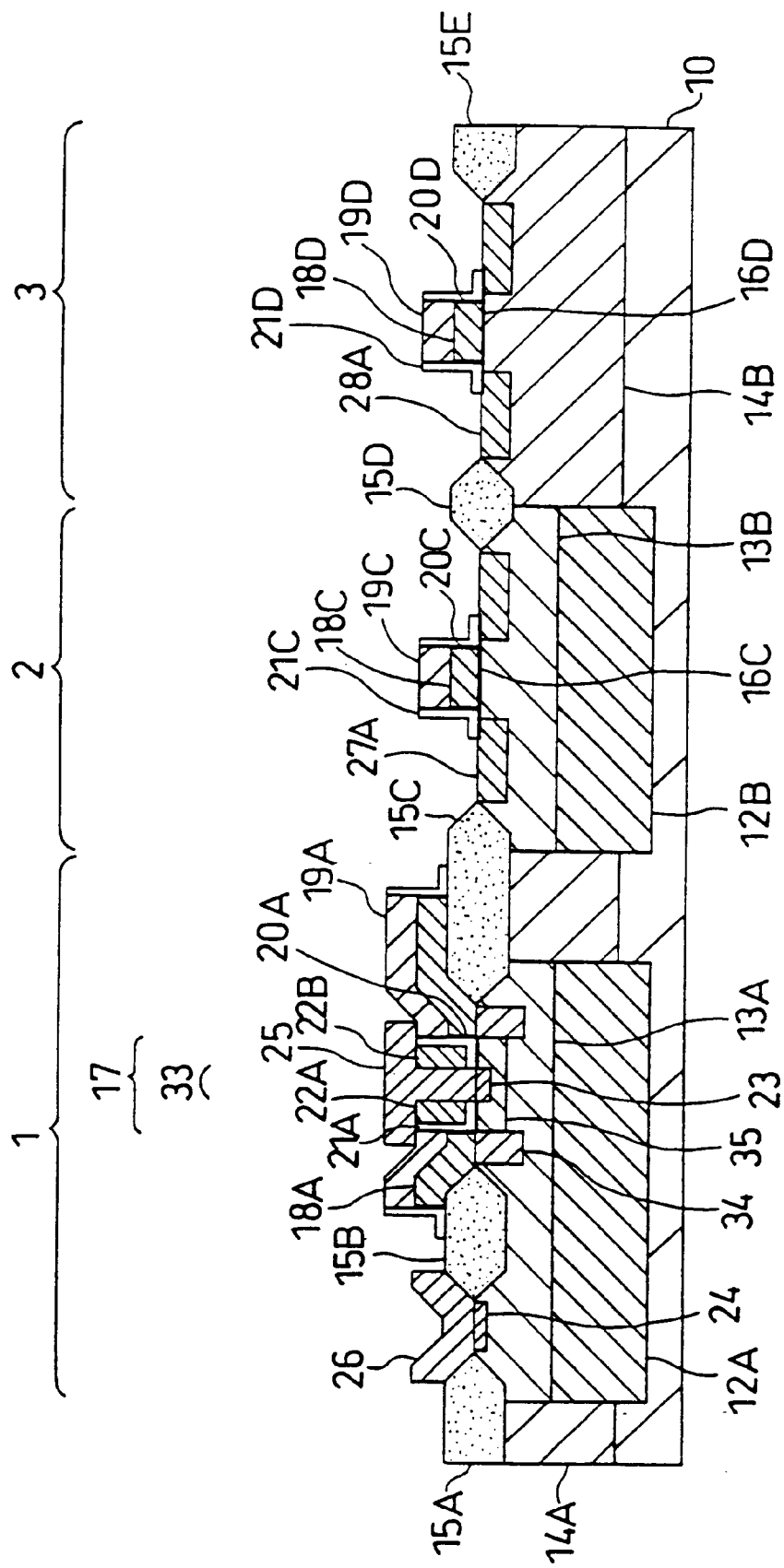

FIG. 6 is now described. 23 is an emitter region for the npn bipolar transistor 1. The emitter region 23 is formed in a manner of self-alignment with the layers 22A, 22B on the side-surfaces of the electrodes 18A, 18A. 24 is a collector contact region for the npn bipolar transistor 1 which is formed by means of thermal annealing. 25 is an emitter extraction electrode for the npn bipolar transistor 1. This electrode 25 is formed of polysilicon. 26 is a collector extraction electrode for the npn bipolar transistor 1. This electrode 26 is formed of polysilicon. 27A is a first LDD region that is formed using the silicon nitride layer 21C as a side-wall. 28A is a second LDD region that is formed using the silicon nitride layer 21D as a side-wall.

A layer of polysilicon is deposited 150–300 nanometers on the entire surface of each device formed on the epitaxial layer 11, by means of an LPCVD step using a silane gas, for formation of the electrodes 25 and 26. An ion implant with ions of arsenic is carried out to the deposited polysilicon layer, at a dose and implant energy of about $1 \times 10^{16}$ cm$^{-2}$ and about 60 KeV. A thermal annealing step is carried out at 900 degrees centigrade for 30–60 minutes in an atmosphere of nitrogen and, as a result, the arsenic impurities contained in the deposited polysilicon layer are diffused into the n-collector region 13A to form the collector contact region 24 and also into the active base region 35 to form the emitter region 23. The junction depth and surface concentration of both the collector contact region 24 and the emitter region 23 are 50 to 100 nanometers and $1 \times 10^{20}$ cm$^{-3}$ to $3 \times 10^{20}$ cm$^{-3}$, respectively.

Next, using a predetermined photoresist pattern by a photolithography step as a mask against etching, an RF etching step, which uses a mixture of HCl, HBr and oxygen, is carried out to the deposited polysilicon layer at a processing pressure in the range of 100×133.322 mPa to 200× 133.322 mPa, whereupon the electrodes 25 and 26 for the npn bipolar transistor 1 are formed having a sheet resistivity in the range of 150 to 300 Ω/□.

Another RF etching step is carried out under the same etching parameters as the previous one, so as to strip the layers 22E and 22F from the electrodes' 18C, 18D side-surfaces. Subsequently, the photoresist mask is removed by means of oxygen-plasma ashing.

Using both a photoresist pattern by a photolithography step and the silicon nitride layer 21C at the side-surface of the electrode 18C as a mask against ion implantation, an ion implant with ions of boron is carried out at a dose and implant energy of about $5 \times 10^{12}$ cm$^{-2}$ and about 20 KeV, respectively and, as a result, the LDD region 27A is formed in a manner of self-alignment with the silicon nitride layer 21C at the side-surface of the electrode 18C. The junction depth and surface concentration of the LDD region 27A are about 0.2 $\mu$m and about $1 \times 10^{18}$ cm$^{-3}$, respectively. Subsequently, an oxygen-plasma ashing step is carried out to remove the photoresist mask.

Next, using both a photoresist pattern produced by a photolithography step and the silicon nitride layer 21D as a mask against ion implantation, an ion implant with ions of phosphorus is carried out at a dose and implant energy of about $1 \times 10^{13}$ cm$^{-2}$ and about 40 KeV, respectively. As a result, the LDD region 28A is formed in a manner of self-alignment with the silicon nitride layer 21D. The junction depth and surface concentration of the LDD region 28A are about 0.2 $\mu$m and $1 \times 10^{18}$ cm$^{-3}$, respectively. The photoresist mask is is stripped by means of oxygen-plasm ashing.

In accordance with the present embodiment, the electrode 18A has the side-wall covered with an insulator layer made up of two thin layers and, as a result, contraction stress by the insulator layer applied to around the perimeter of the emitter-base junction is reduced, whereupon leakage between emitter and base becomes controllable. Additionally, the side-surface of the electrode 18A in contact with the electrode 25 is formed of polysilicon which is a conductor, whereupon the opening 33 comes to have a greater diameter, in other words the aspect ratio of the opening 33 (the ratio of the opening's 33 height to its diameter) decreases. As a result, the emitter resistance of the electrode 25 of polysilicon decreases.

Further, if a polysilicon layer lying over portions of the side-surface of the electrode 18A which do not belong to the region 17, is not stripped, this produces the problem that the npn bipolar transistor 1 is likely to have poor characteristics due to leakage between other conductor layers by the polysilicon layer left unstripped or due to increase in the parasitic capacitance. Such an unstripped polysilicon layer, however, is stripped at the same time that the layer 22E is stripped. Accordingly, such a problem can be avoided without increase in the number of fabrication steps.

Figure 7:
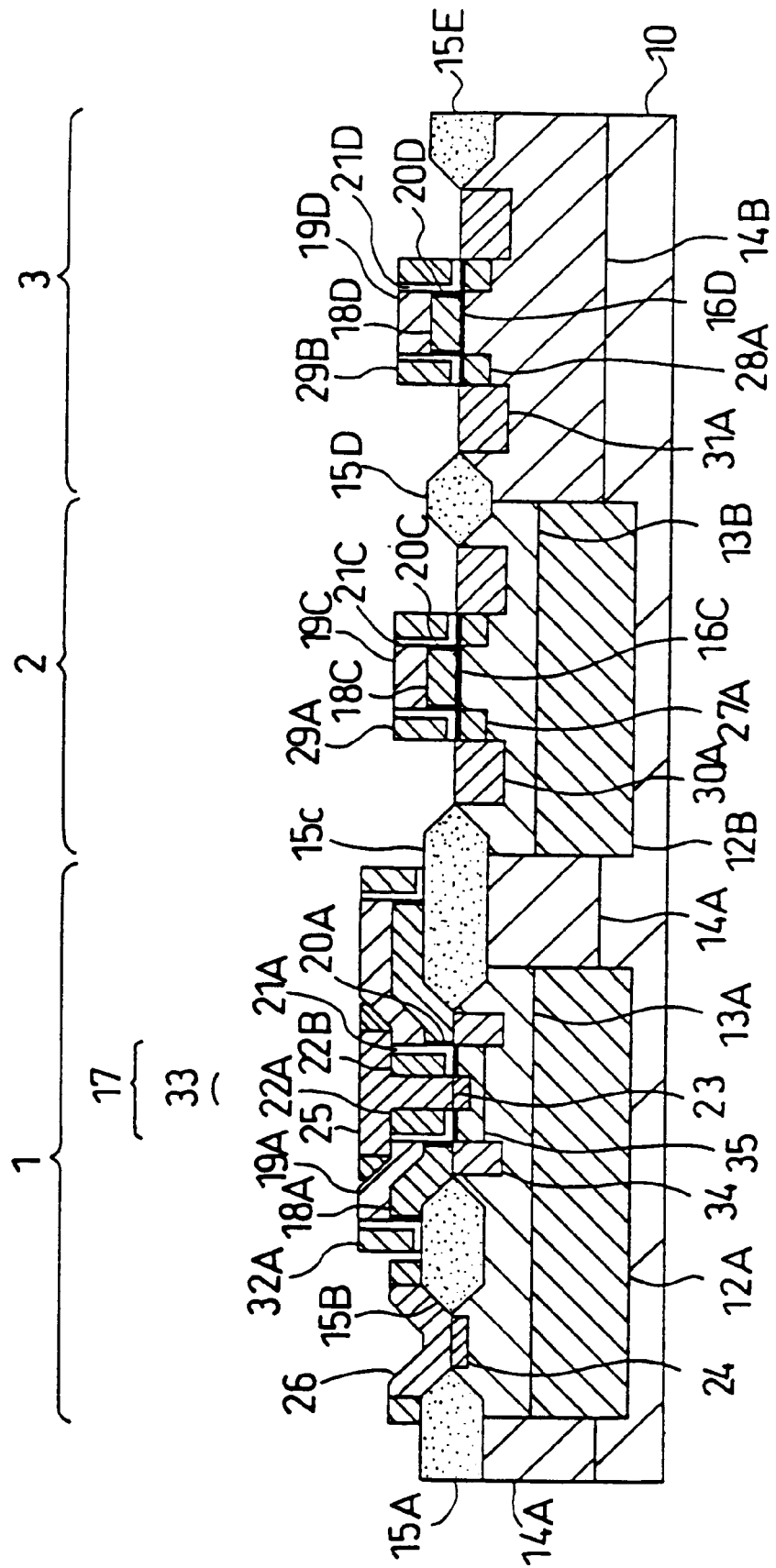
Figure 8:
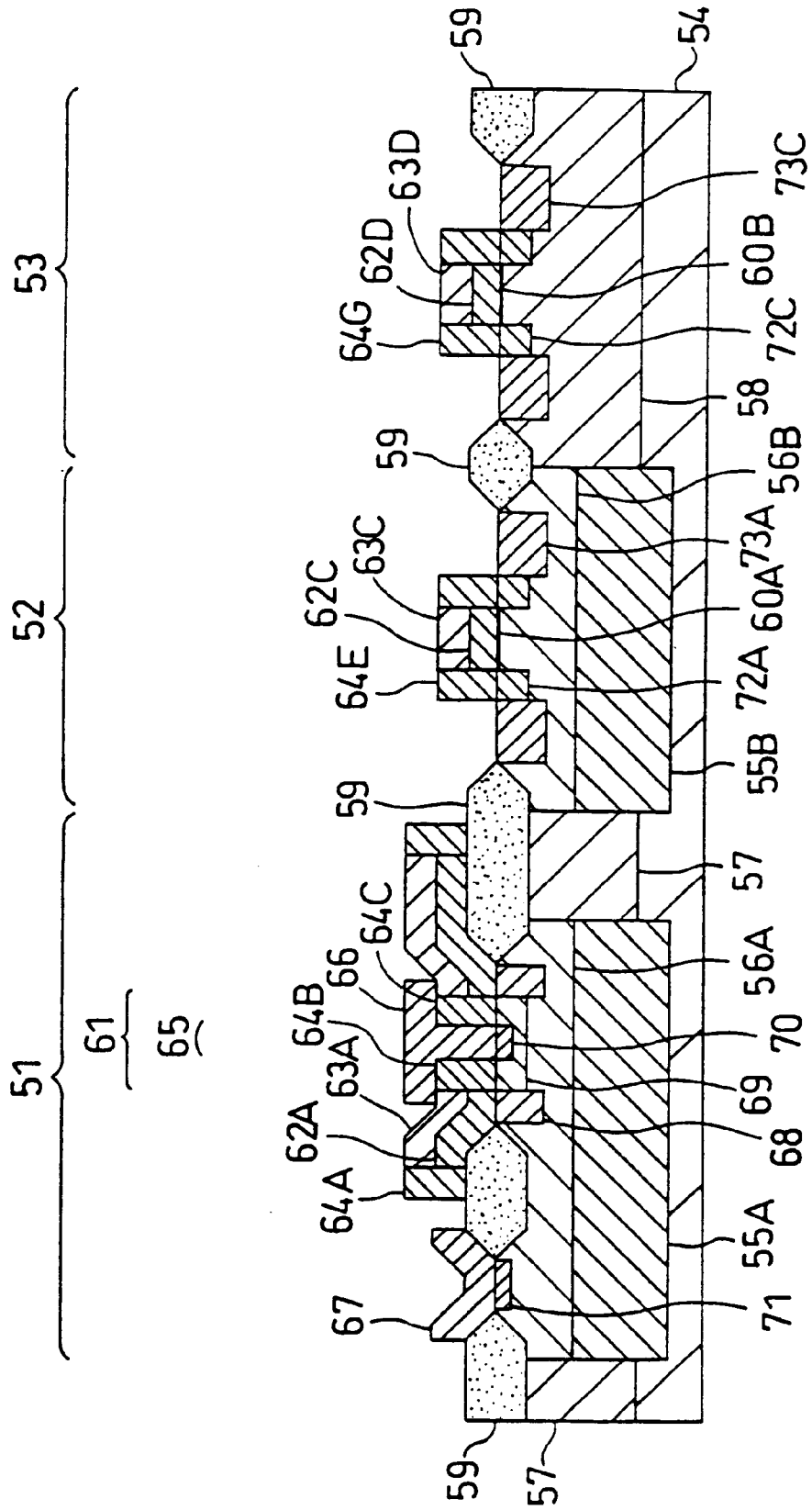
FIG. 8 is a cross section of an SIC apparatus in accordance with a prior art technique.

FIG. 7 is now described. 29A is a TEOS insulator sidewall layer for the electrode 18C. 29B is a TEOS insulator side-wall layer for the electrode 18D. 30A is a first source-drain region formed in a manner of self-alignment with the side-wall layer 29A. 31A is a second source-drain region formed in a manner of self-alignment with the side-wall layer 29B. 32A is a TEOS insulator side-wall layer for the electrode 18A.

Insulator layers for the gate electrode side-walls are formed as follows. An oxide layer is deposited about 150 nanometers over the devices on the epitaxial layer 11 by performing an LPCVD step using a mixture of TEOS and oxygen at about 700 degrees centigrade.

The oxide layer deposited is etched anisotropically using a mixture of oxygen and helium, whereupon the side-wall layers 29A, 29B, 32A are formed.

As a result, a side-wall, which is made up of the oxide layer 20C, the silicon nitride layer 21C, and the insulator side-wall layer 29A, is formed. Additionally, a side-wall, which is made up of the oxide layer 20D, the silicon nitride layer 21D, and the insulator side-wall layer 29B, is formed.

In accordance with the present embodiment, SECOND PARAMETER of both the transistors 1 and 2 is determined by the above-described side-walls. Therefore, FIRST PARAMETER can be determined and optimized independently of SECOND PARAMETER.

An ion implant with ions of boron, in which a photoresist pattern produced by a photolithography step and the insulator side-wall layer 29A are used as a mask against ion implantation, is carried out at a dose and implant energy of about $5\times10^{15}$ cm$^{-2}$ and about 10 KeV, respectively. As a result, the source-drain region 30A is formed in a manner of self-alignment with the side-wall layer 29A. The junction depth and surface concentration of the source-drain region 30A are about 0.2 μm and $1\times10^{20}$ cm$^{-3}$, respectively.

The photoresist mask is stripped by means of oxygen-plasm ashing. Subsequently, an ion implant with ions of arsenic, in which a photoresist pattern produced by a photolithography step and the insulator side-wall layer 29B are used as a mask against ion implantation, is carried out at a dose and implant energy of about $5\times10^{15}$ cm$^{-2}$ and about 40 KeV, respectively. As a result, the source-drain region 31A is formed in a manner of self-alignment with the side-wall layer 29B. The junction depth and surface concentration of the source-drain region 31A are about 0.1 μm and about $1\times10^{20}$ cm$^{-3}$, respectively. The photoresist mask is stripped by means of oxygen-plasma ashing.

The invention claimed is:

1. A method of fabricating a semiconductor integrated circuit apparatus composed of a bipolar transistor and a MOS transistor formed on a single semiconductor substrate, said method comprising the steps of:

(a) forming over said semiconductor substrate an isolation layer for insulating said bipolar transistor and said MOS transistor, and forming a gate insulator layer over device regions excluding the region where said isolation layer has already been formed;

(b) performing an etching process step to strip said gate insulator layer from a region where said bipolar transistor is formed, and depositing a first conductor layer and a first insulator layer over the entirety of said semiconductor substrate;

(c) subjecting said first insulator layer and said first conductor layer to an etching process step to form a base extraction electrode for said bipolar transistor, an insulator layer on top of said base extraction electrode, a gate electrode for said MOS transistor, and an insulator layer on top of said gate electrode;

(d) forming a second insulator layer on a side-surface of said base extraction electrode, on top of an emitter formation region surrounded by said base extraction electrode, and on a side-surface of said gate electrode, and depositing on the entirety of said semiconductor substrate a third insulator layer and a second conductor layer;

(e) subjecting said second conductor layer to an etching process step to form on the side-surface of said base extraction electrode and on the side-surface of said gate electrode a first side-wall layer composed of said second insulator layer, said third insulator layer, and said second conductor layer;

(f) performing an etching step, in which said first side-wall layer serves as an etch mask, to remove said third and second insulator layers from said emitter formation region, for self-aligned formation of an opening for an emitter extraction electrode;

(g) depositing a third conductor layer on the entirety of said semiconductor substrate, selectively etching said third conductor layer to form above said opening said emitter extraction electrode, and performing an etching process step to remove said second conductor layer of said first side-wall layer from other side-surfaces of said base extraction electrode except the side-surface thereof covered with said emitter extraction electrode, and from the side-surface of said gate electrode, to form a second side-wall layer;

(h) forming said source-drain formation region in a manner of self-alignment with said second side-wall layer.

2. A method of fabricating a semiconductor integrated circuit apparatus according to claim 1 further comprising, after said step (g), depositing a fourth insulator layer on the entirety of said semiconductor substrate, and subjecting said fourth insulator layer to an etching process step to form on the side-surface of said gate electrode said second side-wall layer composed of said second insulator layer, said third insulator layer, and said fourth insulator layer.

* * * * *

UNITED STATES PATENT AND TRADEMARK OFFICE
CERTIFICATE OF CORRECTION

PATENT NO. : 6,001,676
DATED : December 14, 1999
INVENTOR(S) : Sawada, et. al.

It is certified that error appears in the above-identified patent and that said Letters Patent is hereby corrected as shown below:

On the Cover Page:

In the Title section, after "FABRICATION" add --METHOD--.

In the "Related U.S. Application Data" section, change "08/570,964" to --08/570,946--.

Signed and Sealed this

First Day of May, 2001

Attest:

NICHOLAS P. GODICI

Attesting Officer   Acting Director of the United States Patent and Trademark Office